US008507892B2

(12) United States Patent
Bangsaruntip et al.

(10) Patent No.: US 8,507,892 B2
(45) Date of Patent: *Aug. 13, 2013

(54) OMEGA SHAPED NANOWIRE TUNNEL FIELD EFFECT TRANSISTORS

(75) Inventors: Sarunya Bangsaruntip, Mount Kisco, NY (US); Josephine B. Chang, Mahopac, NY (US); Isaac Lauer, White Plains, NY (US); Jeffrey W. Sleight, Ridgefield, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/372,714

(22) Filed: Feb. 14, 2012

(65) Prior Publication Data
US 2012/0138900 A1 Jun. 7, 2012

Related U.S. Application Data

(62) Division of application No. 12/630,939, filed on Dec. 4, 2009, now Pat. No. 8,143,113.

(51) Int. Cl.
*H01L 29/66* (2006.01)

(52) U.S. Cl.
USPC ......... 257/24; 257/27; 257/347; 257/E29.168

(58) Field of Classification Search
USPC ...................... 257/24, 38, 296, 368
See application file for complete search history.

(56) References Cited

U.S. PATENT DOCUMENTS

| 4,995,001 A | 2/1991 | Dawson et al. |
| 5,308,445 A | 5/1994 | Takasu |
| 5,438,018 A | 8/1995 | Mori et al. |

(Continued)

FOREIGN PATENT DOCUMENTS

| EP | 217811 A1 | 4/2010 |
| KR | 20090044799 A | 5/2009 |
| WO | 02084757 A1 | 10/2002 |
| WO | W02008069765 A1 | 6/2008 |

OTHER PUBLICATIONS

Alexander J. Gates, "Designing a Nanoelectronic Circuit to Control a Millimeter-scale Walking Robot," Mitre Technical Paper, Nov. 2004, http://www.mitre.org/work/tech_papers/tech_papers_04/04_1248/04_1248.pdf.

(Continued)

*Primary Examiner* — Thanh Nguyen
(74) *Attorney, Agent, or Firm* — Cantor Colburn LLP; Vazken Alexanian

(57) ABSTRACT

A method for forming a nanowire tunnel field effect transistor device includes forming a nanowire connected to a first pad region and a second pad region, the nanowire including a core portion and a dielectric layer, forming a gate structure on the dielectric layer of the nanowire, forming a first protective spacer on portions of the nanowire, implanting ions in a first portion of the exposed nanowire and the first pad region, implanting in the dielectric layer of a second portion of the exposed nanowire and the second pad region, removing the dielectric layer from the second pad region and the second portion, removing the core portion of the second portion of the exposed nanowire to form a cavity, and epitaxially growing a doped semiconductor material in the cavity to connect the exposed cross sections of the nanowire to the second pad region.

7 Claims, 6 Drawing Sheets

(56) References Cited

U.S. PATENT DOCUMENTS

| | | | |
|---|---|---|---|
| 5,552,622 A | 9/1996 | Kimura | |
| 5,574,308 A | 11/1996 | Mori et al. | |
| 5,668,046 A | 9/1997 | Koh et al. | |
| 6,365,465 B1 | 4/2002 | Chan et al. | |
| 6,642,115 B1 | 11/2003 | Cohen et al. | |
| 6,653,209 B1 | 11/2003 | Yamagata | |
| 6,806,141 B2 | 10/2004 | Kamins | |
| 6,835,618 B1 | 12/2004 | Dakshina-Murthy et al. | |
| 6,855,606 B2 | 2/2005 | Chen et al. | |
| 6,882,051 B2 | 4/2005 | Majumdar et al. | |
| 6,891,227 B2 | 5/2005 | Appenzeller et al. | |
| 6,903,013 B2 | 6/2005 | Chan et al. | |
| 6,996,147 B2 | 2/2006 | Majumdar et al. | |
| 7,101,762 B2 | 9/2006 | Cohen et al. | |
| 7,151,209 B2 | 12/2006 | Empedocles et al. | |
| 7,180,107 B2 | 2/2007 | Appenzeller et al. | |
| 7,211,853 B2 | 5/2007 | Bachtold et al. | |
| 7,253,060 B2 | 8/2007 | Yun et al. | |
| 7,297,615 B2 | 11/2007 | Cho et al. | |
| 7,311,776 B2 | 12/2007 | Lin et al. | |
| 7,443,025 B2 | 10/2008 | Verbist | |
| 7,446,025 B2 | 11/2008 | Cohen et al. | |
| 7,449,373 B2 | 11/2008 | Doyle et al. | |
| 7,452,759 B2 | 11/2008 | Sandhu | |
| 7,452,778 B2 | 11/2008 | Chen et al. | |
| 7,456,068 B2 | 11/2008 | Kavalieros et al. | |
| 7,456,476 B2 | 11/2008 | Hareland et al. | |
| 7,473,943 B2 | 1/2009 | Mostarshed et al. | |
| 7,498,211 B2 | 3/2009 | Ban et al. | |
| 7,550,333 B2 | 6/2009 | Shah et al. | |
| 7,569,941 B2 | 8/2009 | Majumdar et al. | |
| 7,642,578 B2 | 1/2010 | Lee et al. | |
| 7,791,144 B2 | 9/2010 | Chidambarrao et al. | |
| 7,799,657 B2 | 9/2010 | Dao | |
| 7,803,675 B2 | 9/2010 | Suk et al. | |
| 7,834,345 B2 | 11/2010 | Bhuwalka et al. | |
| 7,871,870 B2 | 1/2011 | Mostarshed et al. | |
| 7,893,506 B2 | 2/2011 | Chau et al. | |
| 8,097,515 B2 * | 1/2012 | Bangsaruntip et al. | 438/282 |
| 8,173,993 B2 * | 5/2012 | Bangsaruntip et al. | 257/38 |
| 2004/0149978 A1 | 8/2004 | Snider | |
| 2004/0166642 A1 | 8/2004 | Chen et al. | |
| 2005/0121706 A1 | 6/2005 | Chen et al. | |
| 2005/0266645 A1 | 12/2005 | Park | |
| 2005/0275010 A1 | 12/2005 | Chen et al. | |
| 2006/0033145 A1 | 2/2006 | Kakoschke et al. | |
| 2006/0138552 A1* | 6/2006 | Brask et al. | 257/369 |
| 2006/0197164 A1* | 9/2006 | Lindert et al. | 257/409 |
| 2007/0001219 A1 | 1/2007 | Radosavljevic et al. | |
| 2007/0267619 A1 | 11/2007 | Nirschl | |
| 2007/0267703 A1 | 11/2007 | Chong et al. | |
| 2007/0284613 A1 | 12/2007 | Chui et al. | |
| 2008/0014689 A1 | 1/2008 | Cleavelin et al. | |
| 2008/0061284 A1 | 3/2008 | Chu et al. | |
| 2008/0067495 A1 | 3/2008 | Verhulst | |
| 2008/0067607 A1 | 3/2008 | Verhulst et al. | |
| 2008/0079041 A1 | 4/2008 | Suk et al. | |
| 2008/0085587 A1 | 4/2008 | Wells et al. | |
| 2008/0121932 A1 | 5/2008 | Ranade | |
| 2008/0128760 A1 | 6/2008 | Jun et al. | |
| 2008/0135949 A1 | 6/2008 | Lo et al. | |
| 2008/0142853 A1 | 6/2008 | Orlowski | |
| 2008/0149914 A1 | 6/2008 | Samuelson et al. | |
| 2008/0149997 A1 | 6/2008 | Jin et al. | |
| 2008/0150025 A1 | 6/2008 | Jain | |
| 2008/0179752 A1 | 7/2008 | Yamauchi et al. | |
| 2008/0191196 A1 | 8/2008 | Lu et al. | |
| 2008/0224224 A1 | 9/2008 | Vandenderghe et al. | |
| 2008/0227259 A1 | 9/2008 | Avouris et al. | |
| 2008/0246021 A1 | 10/2008 | Suk et al. | |
| 2008/0247226 A1 | 10/2008 | Liu et al. | |
| 2008/0290418 A1 | 11/2008 | Kalburge | |
| 2009/0026553 A1 | 1/2009 | Bhuwalka et al. | |
| 2009/0057650 A1 | 3/2009 | Lieber et al. | |
| 2009/0057762 A1 | 3/2009 | Bangsaruntip et al. | |
| 2009/0061568 A1 | 3/2009 | Bangsaruntip et al. | |
| 2009/0090934 A1 | 4/2009 | Tezuka et al. | |
| 2009/0134467 A1 | 5/2009 | Ishida et al. | |
| 2009/0149012 A1 | 6/2009 | Brask et al. | |
| 2009/0181477 A1 | 7/2009 | King et al. | |
| 2009/0217216 A1 | 8/2009 | Lee et al. | |
| 2009/0294864 A1 | 12/2009 | Suk et al. | |
| 2010/0193770 A1 | 8/2010 | Bangsaruntip et al. | |
| 2010/0207102 A1 | 8/2010 | Lee et al. | |
| 2011/0133161 A1* | 6/2011 | Bangsaruntip et al. | 257/24 |
| 2011/0133162 A1* | 6/2011 | Bangsaruntip et al. | 257/24 |
| 2011/0133164 A1* | 6/2011 | Bangsaruntip et al. | 257/24 |
| 2011/0147840 A1 | 6/2011 | Cea et al. | |
| 2012/0146000 A1* | 6/2012 | Bangsaruntip et al. | 257/29 |

OTHER PUBLICATIONS

Andriotis et al., Realistic nanotube-metal contact configuration for molecular electronics applications, IEEE Sensors Journal, vol. 8, No. 6, Jun. 2008.

R, Bahar, 'Trends and Future Directions in Nano Structure Based Computing and Fabrication', ICCD 2006, International Conf. on Computer Design, Oct. 1-4, 2007, pp. 522-527.

Buddharaju et al., 'Gate-All-Around Si-Nanowire CMOS Inverter Logic Fabricated Using Top-Down Approach', European Solid-State Device Research Conference, Sep. 11-11, 2007, pp. 303-306.

Chen et al., 'Demonstration of Tunneling FETs Based on Highly Scalable Verticle Silicon Nanowires', IEEE Electron Device Letters, vol. 30, No. 7, Jul. 2009, pp. 754-756.

Ernst et al., "3D Multichannels and Stacked Nanowires Technologies for New Design Opportunities in Nanoelectronics," IEEE International Conference on Integrated Circuit Design and Technology and Tutorial, 2008. ICICDT 2008. Jun. 2-4, 2008 pp. 265-268.

G.W. Neudeck, "An Overview of Double-Gate MOSFETs," Proceedings of 15th Biennial University/Government/Industry Microelectronics Symposium. UGIM 2003. New York, NY: IEEE, US, Jun. 30-Jul. 2, 2003, pp. 214-217.

Hu et al., 'Fringing field effects on electrical resistivity of semiconductor nanowire-metal contacts', Applied Physics Letters 92, 083503_2008.

International Search Report; International Application No. PCT/US2011/029304; International Filing Date: Mar. 22, 2011; Date of Mailing: May 20, 2011.

Jie Xiang et al., "Ge/Si Nanowire Heterostructures as High-Performance Field-Effect Transistors," Nature 441, 489-493 (May 25, 2006).

Knoch et al., 'Tunneling phenomena in carbon nanotube field-effect transistors', Phys Stat Sol. (a) 205, No. 4, 679-694 (2008).

Leonard et al., 'Size-dependent effects on electrical contacts to nanotubes and nanowires', Phys Rev Lett., Jul. 14, 2006; 97(2):026804.

M. M. Ziegler et al., "The CMOS/NANO Interface from a Circuits Perspective," ISCAS '03. Proceedings of the 2003 International Symposium on Circuits and Systems, May 25-28, 2003, vol. 4, pp. IV-904-IV-907.

M. T. Bjork et al., "Silicon Nanowire Tunneling Field-Effect Transistors," Applied Physics Letters 92, 193504 (2008).

Ma et al., 'High-performance nanowire complementary metal-semiconductor inverters', Applied Physics Letters 93, 053105_2008.

Saumitra Raj mehrotra, A Simulation Study of Silicom Nanowire Field Effect Transistors (FETs), University of Cincinnati, Jul. 2007.

Lauhon et al., 'Epitaxial core-shell and core-multishell nanowire heterostructures', Nature, vol. 420, Nov. 7, 2002, pp. 57-61.

International Search Report; International Application No. PCT/EP2010/066961; International Filing Date: Nov. 8, 2010; Date of Mailing: Feb. 10, 2011.

International Search Report; International Application No. PCT/EP2010/066483; International Filing Date: Oct. 29, 2010; Date of Mailing: Feb. 7, 2011.

International Search Report; International Application No. PCT/EP2011/053174; International Filing Date: Mar. 3, 2011; Date of Mailing: May 31, 2011.

International Search Report—Written Opinion; International Application No. PCT/EP2010/066483; International Filing Date: Oct. 29, 2010; Date of Mailing: Feb. 7, 2011.

International Search Report—Written Opinion; International Application No. PCT/EP2010/066961; International Filing Date: Nov. 8, 2010; Date of Mailing: Feb. 10, 2011.

International Search Report—Written Opinion; International Application No. PCT/EP2011/053174; International Filing Date: Mar. 3, 2011; Date of Mailing: May 31, 2011.

Pavanello et al., "Evaluation of Triple-Gate FinFETs With SiO2-HfO2-TiN Gate Stack Under Analog Operation," Solid State Electronics, Elsevier Science Publishers, Barking, GB, vol. 51, No. 2, Mar. 7, 2007, pp. 285-291.

Singh et al., 'Si, SiGe Nanowire Devices by Top-Down Technology and Their Applications', IEEE Transactions on Electron Devices, vol. 55, No. 11, Nov. 2008, pp. 3107-3118.

Taichi Su et al., "New Planar Self-Aligned Double-Gate Fully Depleted P-MOSFET's Using Epitaxial Lateral Overgrowth (ELO) and Selectively Grown Source/Drain (S/D)," 2000 IEEE International SOI Conference, Oct. 2000.

N. Checka, 'Circuit Architecture for 3D Integration', Chapter 13 in Wafer Level 3-D ICs Process Technology, ed. C.S. Tan, Springer US, 2008, ISBN 978-0-387-76534-1.

International Search Report—Written Opinion; International Application No. PCT/US2011/029304; International Filing Date: Mar. 22, 2011; Date of Mailing: May 20, 2011.

International Search Report; International Application No. PCT/US11/49501; International Filing Date: Aug. 29, 2011; Date of Mailing: Jan. 18, 2012.

International Search Report Written Opinion; International Application No. PCT/US11/49501; International Filing Date: Aug. 29, 2011; Date of Mailing: Jan. 18, 2012.

Chen et al., "An Integrated Logic Circuit Assembled ona Single Carbon Nanotube", www.sciencemag.org Science, vol. 311, Mar. 24, 2006, p. 1735.

Derycke, et al, "Carbon Nanotube Inter- and Intramolecular Logic Gates" Nano Letters, Sep. 2001, vol. 1, No. 9, pp. 453-456.

Office Action—Non-Final for U.S. Appl. No. 12/684,280, filed Jan. 8, 2010; First Named Inventor: Sarunya Bangsaruntip; Mailing Date: May 2, 2011.

Office Action—Non-Final for U.S. Appl. No. 12/856,718, filed Aug. 16, 2010; first Named Inventor Sarunya Bangsaruntip; Mailing Date: Jul. 9, 2012.

Office Action—Non-Final for U.S. Appl. No. 13/372,719, filed Feb. 14, 2012; First Named Inventor: Sarunya Bangsaruntip; Mailing Date: May 7, 2012.

Office Action—Restriction Election for U.S. Appl. No. 12/684,280, filed Jan. 8, 2010; First Named Inventor: Sarunya Bangsaruntip; Mailing Date: Feb. 10, 2011.

Office Action—Final for U.S. Appl. No. 12/684,280, filed Jan. 8, 2010; First Namd Inventor: Sarunya Bangsaruntip; Mailing Date: Oct. 5, 2011.

Transmittal and International Preliminary Report on Patentability for International Application No. PCT/US2011/029304; International Filing Date: Mar. 22, 2011; date of mailing Oct. 26, 2012, 2 pages.

Notice of Allowance for U.S. Appl. No. 12/776,485, filed May 10, 2010; First Named Inventor: Sarunya Bangsaruntip; Mailing Date: Sep. 26, 2012.

Office Action—Final for U.S. Appl. No. 13/372,719, filed Feb. 14, 2012; First Named Inventor: Sarunya Bangsaruntip; Mailing Date: Sep. 4, 2012.

Office Action—Non-Final for U.S. Appl. No. 12/778,315, filed May 12, 2010; First Named Inventor: Sarunya Bangsaruntip; Mailing Date: Mar. 26, 2012.

Office Action—Non-Final for U.S. Appl. No. 12/631,199, filed Dec. 4, 2009; First Named Inventor: Sarunya Bangsaruntip; Mailing Date: Jun. 13, 2012.

Office Action—Non-Final for U.S. Appl. No. 12/884,707, filed Sep. 17, 2010; First Named Inventor: Sarunya Bangsaruntip; Mailing Date: Oct. 2, 2012.

Office Action—Non-Final for U.S. Appl. No. 12/856,718, filed Aug. 16, 2010; First Named Inventor: Sarunya Bangsaruntip; Mailing Date: Jul. 9, 2012.

Office Action—Restriction-Election for U.S. Appl. No. 12/856,718, filed Aug. 16, 2010; First Named Inventor: Sarunya Bangsaruntip; Mailing Date: Apr. 9, 2012.

Written Opinion for International Application No. PCT/US2011/029304; International Filing Date: Mar. 22, 2011; mailing date: May 20, 2011; 5 pages.

* cited by examiner

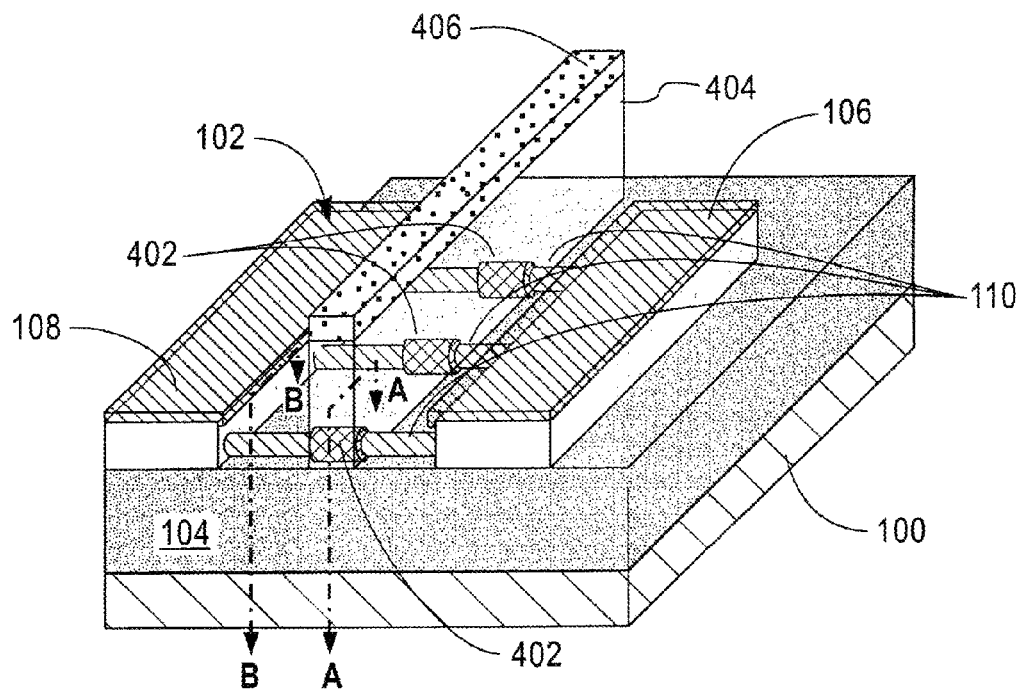
FIG. 3
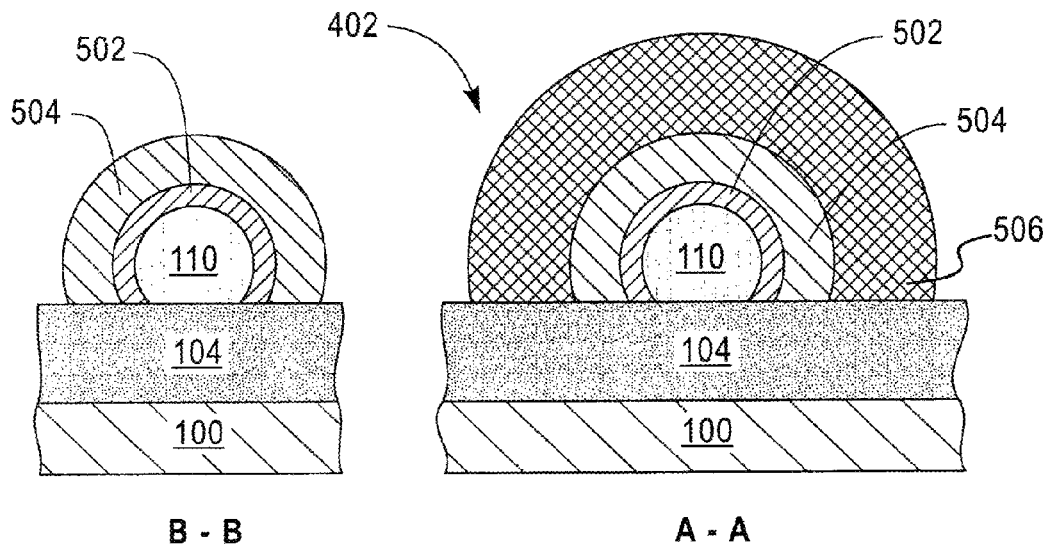
B - B
FIG. 4B
A - A
FIG. 4A

OMEGA SHAPED NANOWIRE TUNNEL FIELD EFFECT TRANSISTORS

CROSS REFERENCE TO RELATED APPLICATIONS

This is a divisional application of application Ser. No. 12/630,939, filed Dec. 4, 2009.

This application is related to co-pending application Ser. No. 12/631,199, filed Dec. 4, 2009, application Ser. No. 12/631,205, filed Dec. 4, 2009, application Ser. No. 12/630,942, filed Dec. 4, 2009, application Ser. No. 12/631,213, filed Dec. 4, 2009 and application Ser. No. 12/631,342, filed Dec. 4, 2009, all of which are incorporated by reference herein.

FIELD OF INVENTION

The present invention relates to semiconductor nanowire tunnel field effect transistors.

DESCRIPTION OF RELATED ART

A nanowire tunnel field effect transistor (FET) includes doped portions of nanowire that contact the channel region and serve as source and drain regions of the device. Previous fabrication methods that used ion-implantation to dope the small diameter nanowire may result in undesirable amorphization of the nanowire or an undesirable junction doping profile.

BRIEF SUMMARY

In one aspect of the present invention, a method for forming a nanowire tunnel field effect transistor (FET) device includes forming a nanowire connected to a first pad region and a second pad region on a semiconductor substrate, the nanowire including a core portion and a dielectric layer on the core portion, the first pad region and the second pad region including a dielectric layer, forming a gate structure on a portion of the dielectric layer of the nanowire, forming a first protective spacer adjacent to sidewalls of the gate structure and on portions of the nanowire extending from the gate structure, implanting a first type of ions in a first portion of the exposed nanowire and the first pad region, implanting a second type of ions in the dielectric layer of a second portion of the exposed nanowire and the second pad region, removing the dielectric layer from the second pad region and the second portion of the exposed nanowire to reveal the core portion of the second portion of the exposed nanowire, removing the core portion of the second portion of the exposed nanowire to form a cavity partially defined by the core portion of the nanowire surrounded by the gate structure and the spacer, and epitaxially growing a doped semiconductor material in the cavity from exposed cross sections of the nanowire and the second pad region to connect the exposed cross sections of the nanowire to the second pad region.

In another aspect of the present invention, a nanowire tunnel field effect transistor (FET) device includes a channel region disposed on a semiconductor substrate including a silicon portion having a first distal end and a second distal end, the silicon portion is surrounded by a gate structure disposed on the silicon portion, a drain region including an n-type doped silicon portion extending from the first distal end, a cavity partially defined by the second distal end of the silicon portion and an inner diameter of the gate structure, a source region including a doped epi-silicon nanowire extension epitaxially extending from the second distal end of the silicon portion in the cavity.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

FIGS. 1-12 illustrate an exemplary method for forming a tunnel field effect transistor (FET) device.

DETAILED DESCRIPTION

Figure 1:
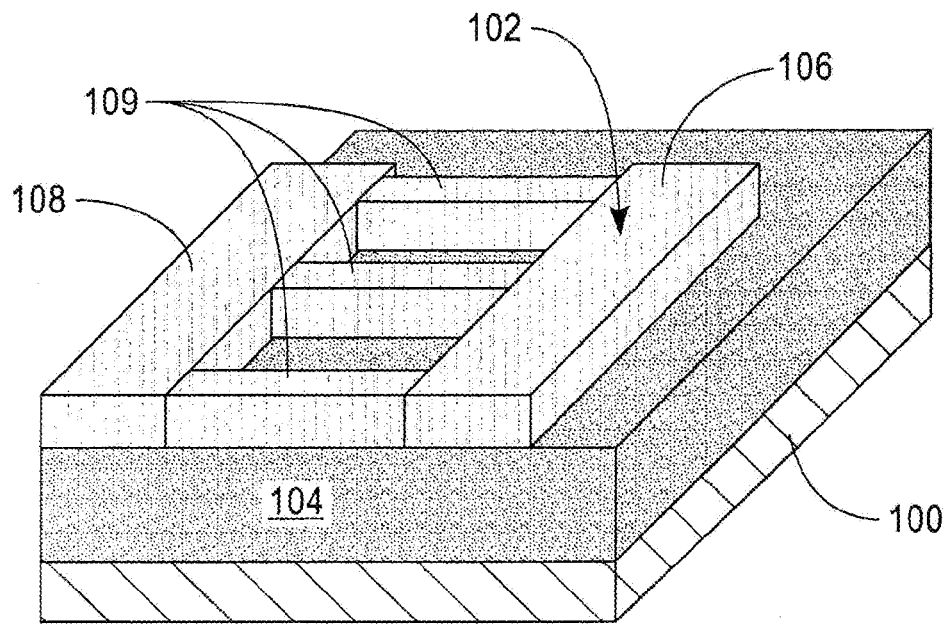

With reference now to FIG. 1, a silicon on insulator (SOI) portion 102 is defined on a buried oxide (BOX) layer 104 that is disposed on a silicon substrate 100. The SOI portion 102 includes a SOI pad region 106, a SOI pad region 108, and nanowire portions 109. The SOI portion 102 may be patterned by the use of lithography followed by an etching process such as, for example, reactive ion etching (RIE).

Figure 2:
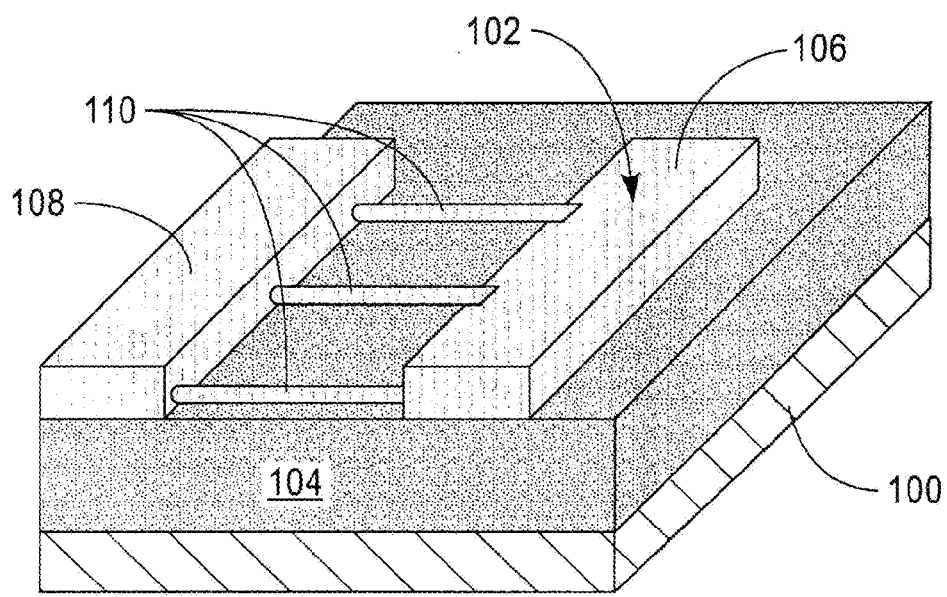

FIG. 2 illustrates nanowires 110 disposed on the BOX layer 104 that are smoothed to form elliptical shaped (and in some cases, cylindrical shaped) nanowires 110 on the BOX layer 104. The smoothing of the nanowires may be performed by, for example, annealing of the nanowires 109 in hydrogen. Example annealing temperatures may be in the range of 600° C.-900° C., and a hydrogen pressure of approximately 600 torr to 7 torr. The diameter of the nanowires 110 may be reduced by an oxidation process. The reduction of the diameter of the nanowires 110 may be performed by, for example, an oxidation of the nanowires 110 followed by the etching of the grown oxide. The oxidation and etching process may be repeated to achieve a desired nanowire 110 diameter. Once the diameters of the nanowires 110 have been reduced, gates are formed over the channel regions of the nanowires 110 (described below).

FIG. 3 illustrates gates 402 that are formed on the nanowires 110, as described in further detail below, and capped with a polysilicon layer (capping layer) 404. A hardmask layer 406, such as, for example silicon nitride ($Si_3N_4$) is deposited over the polysilicon layer 404. The polysilicon layer 404 and the hardmask layer 406 may be formed by depositing polysilicon material over the BOX layer 104 and the SOI portion 102, depositing the hardmask material over the polysilicon material, and etching by RIE to form the polysilicon layer 406 and the hardmask layer 404. The etching of the gate 402 may be performed by directional etching that results in straight sidewalls of the gate 402. Following the directional etching, polysilicon 404 remains under the nanowires 110 and outside the region encapsulated by the gate 402. Isotropic etching may be performed to remove polysilicon 404 from under the nanowires 110.

FIG. 4A illustrates a cross sectional view of a gate 402 along the line A-A (of FIG. 3). The gate 402 is formed by depositing a first gate dielectric layer (high K layer) 502, such as silicon dioxide ($SiO_2$) around a channel portion of the nanowire 110 and on the SOI pad regions 106 and 108. A second gate dielectric layer (high K layer) 504 such as, for example, hafnium oxide ($HfO_2$) is formed around the first gate dielectric layer 502. A metal layer 506 such as, for example, tantalum nitride (TaN) is formed on the second gate dielectric layer 504. The metal layer 506 is surrounded by polysilicon layer 404 (of FIG. 3). Doping the polysilicon layer 404 with impurities such as boron (p-type), or phosphorus (n-type) makes the polysilicon layer 404 conductive. The metal layer 506 is removed by an etching process such as, for example, RIE from the nanowire 110 and the SOI pad regions 106 and 108 that are outside of the channel region, and results in the gate 402. FIG. 4B illustrates a cross sectional view of a portion of the nanowire 110 along the line B-B (of FIG. 3).

Figure 5:
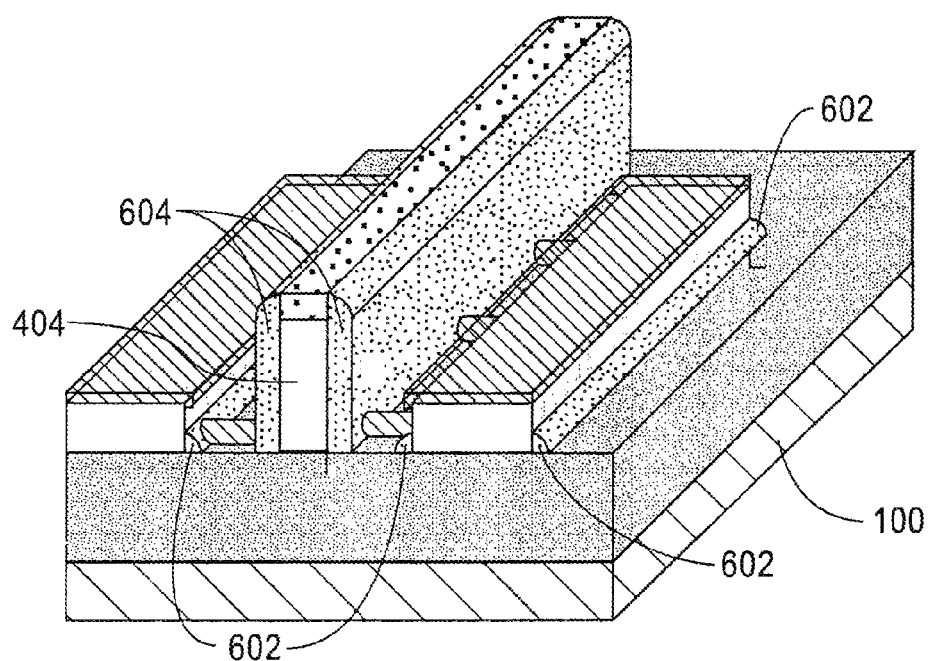

FIG. 5 illustrates the spacer portions 604 formed along opposing sides of the polysilicon layer 404. The spacers are formed by depositing a blanket dielectric film such as silicon nitride and etching the dielectric film from all horizontal surfaces by RIE. The spacer walls 604 are formed around portions of the nanowire 110 that extend from the polysilicon layer 404 and surround portions of the nanowires 110.

Figure 6:
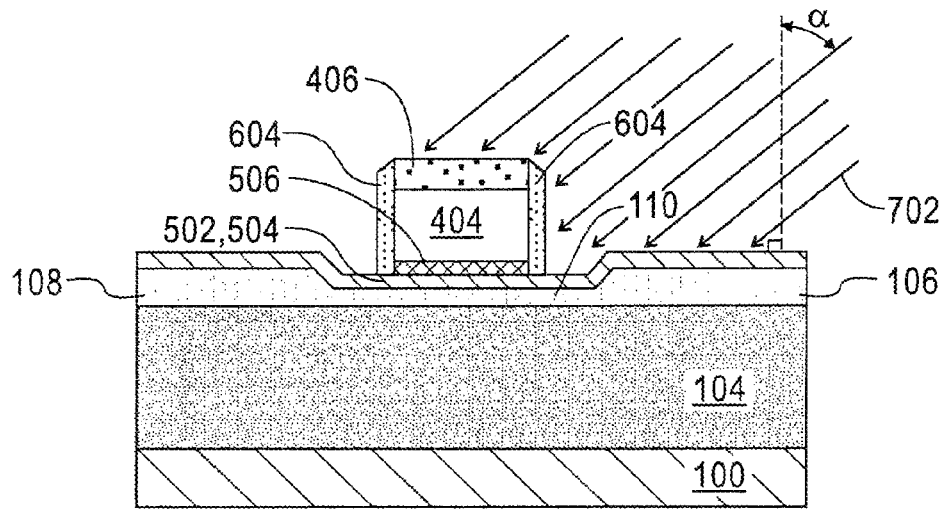

FIG. 6 illustrates a cross-sectional view of FIG. 5 following the formation of the spacers 604. In the illustrated embodiment, the exposed dielectric layers 502 and 504 on one side of the device are doped with n-type ions 702 that are implanted at an angle ($\alpha$), the angle $\alpha$ may, for example, range from 5-50 degrees. The implantation of the n-type ions 702 at the angle a exposes one side of the device to the n-type ions 702, while the opposing side remains unexposed due to the height and position of the polysilicon layer 404. Once the ions 702 are implanted, an annealing process is performed to overlap the device. The annealing process results in a shallow doping gradient of n-type ions in the channel region of the device.

Figure 7:
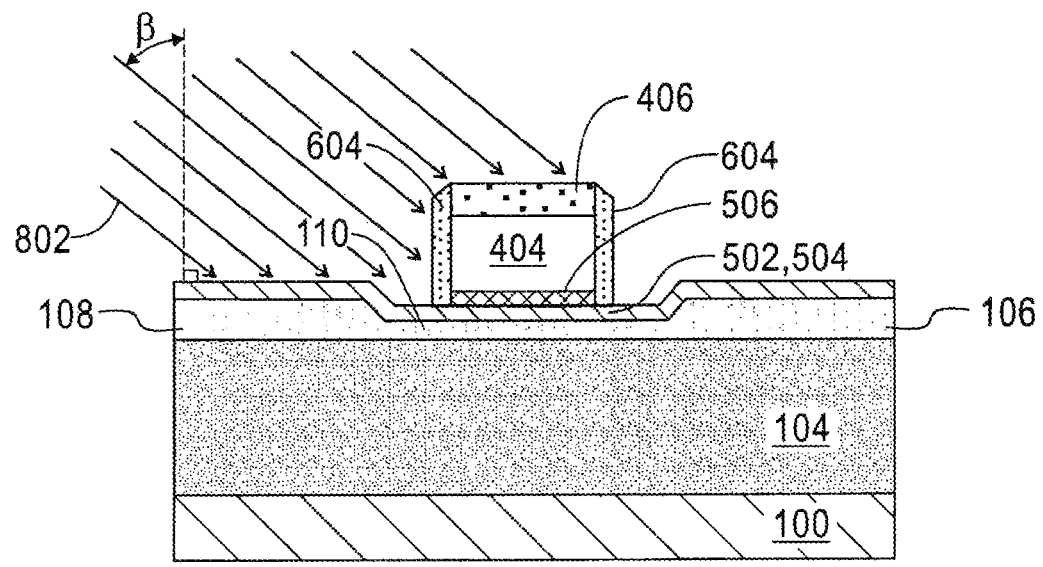

FIG. 7 illustrates a cross-sectional view of the device. In the illustrated embodiment the exposed dielectric layers 502 and 504 on the opposing side of the device (the un-doped side) is implanted with ions 802 at an angle ($\beta$). The ions 802 may include, for example, germanium, argon, or xenon. The implantation of the ions 802 at the angle $\beta$ in the dielectric layers 502 and 504 damages the dielectric layers dielectric layers 502 and 504 on the un-doped side of the device, while the doped side of the device remains unexposed to the ions 802.

Figure 8:
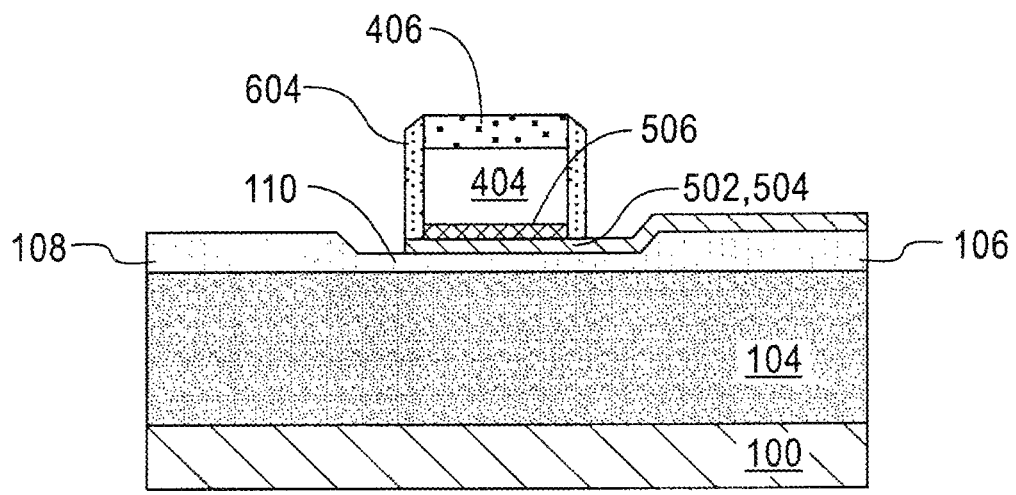

FIG. 8 illustrates a cross-sectional view of the resultant structure following a wet etching process such as, for example, a HF chemical etch that removes the damaged dielectric layers 502 and 504 that were implanted with the ions 802 (of FIG. 8) from the nanowire 110. The n-type doped dielectric layers 502 and 505 remain on the nanowire 110.

Figure 9:
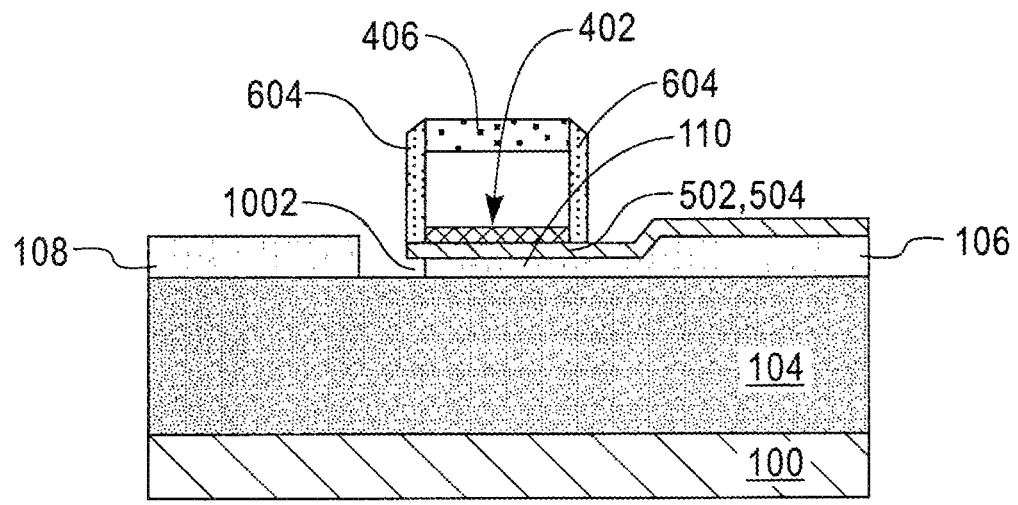

FIG. 9 illustrates a cross-sectional view of the resultant structure following an etching process, such as, for example, a wet chemical or vapor etching process that etches exposed silicon, and removes the exposed silicon nanowire 110. The etching process removes a portion of the nanowire 110 that is surrounded by the spacer wall 604 and the gate 402 to recess the nanowires 110 into the gates 402, and form a cavity 1002 defined by the gate 402, the nanowire 110, the BOX layer 104, and the spacer wall 604.

The lateral etching process that forms cavity 1002 may be time based. Width variation in spacer 604 may lead to variations in the position of the edges of the recessed nanowire 110. The etching rate in the cavity 1002 depends on the size of the cavity, with narrower orifice corresponding to slower etch rates. Variations in the nanowire size will therefore lead to variations in the depth of cavity 1002.

Figure 10:
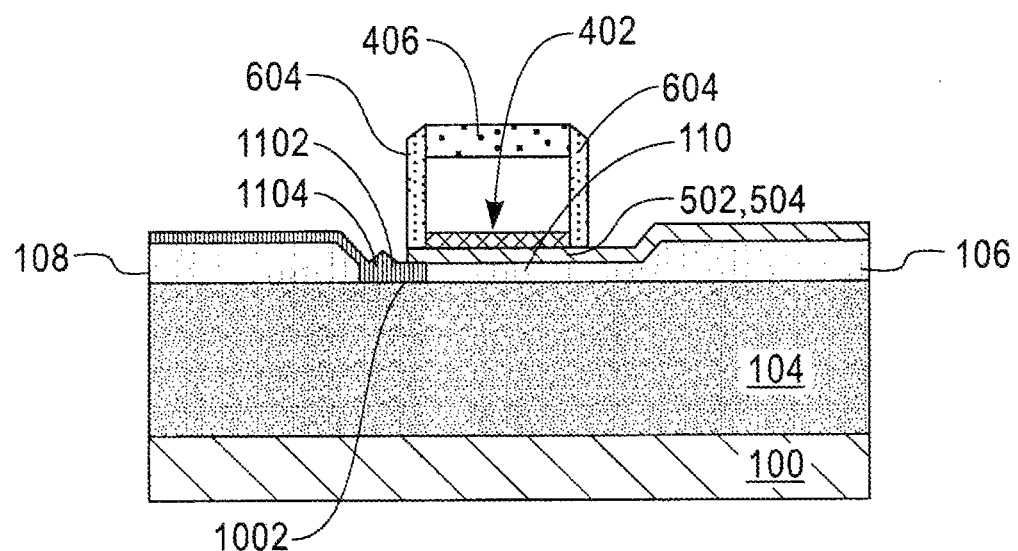

FIG. 10 illustrates cross-sectional views of the resultant structures following a selective epi-silicon growth to form nanowire extensions 1102 and 1104. The nanowire extension 1102 is epitaxially grown in the cavity 1022 (of FIG. 9) from the exposed nanowire 110 in the gate 402 to form the nanowire extension 1102. The nanowire extension 1104 is epitaxially grown from the SOI pad region 108. The nanowire extensions 1102 and 1104 are grown until they meet to connect the SOI pad region 108 to the nanowire 110 in the channel region of the gate 402. The nanowire extensions 1102 and 1104 are formed by epitaxially growing, for example, in-situ doped silicon (Si), a silicon germanium (SiGe), or germanium (Ge) that may be either n-type or p-type doped. As an example, a chemical vapor deposition (CVD) reactor may be used to perform the epitaxial growth. Precursors for silicon epitaxy include $SiCl_4$, $SiH_4$ combined with HCL. The use of chlorine allows selective deposition of silicon only on exposed silicon surfaces. A precursor for SiGe may be $GeH_4$, which may obtain deposition selectivity without HCL. Precursors for dopants may include $PH_3$ or $AsH_3$ for n-type doping and $B_2H_6$ for p-type doping. Deposition temperatures may range from 550° C. to 1000° C. for pure silicon deposition, and as low as 300° C. for pure Ge deposition.

Once epi-nanowire extensions 1102 and 1104 are formed, the doping may be activated by, for example, a laser or flash anneal process. The laser or flash annealing may reduce diffusion of ions into the channel region 1105 of the gate 402, and result in a high uniform concentration of doping in the epi-nanowire extensions 1102 and 1104 with an abrupt junction in the nanowires 110.

Figure 11:
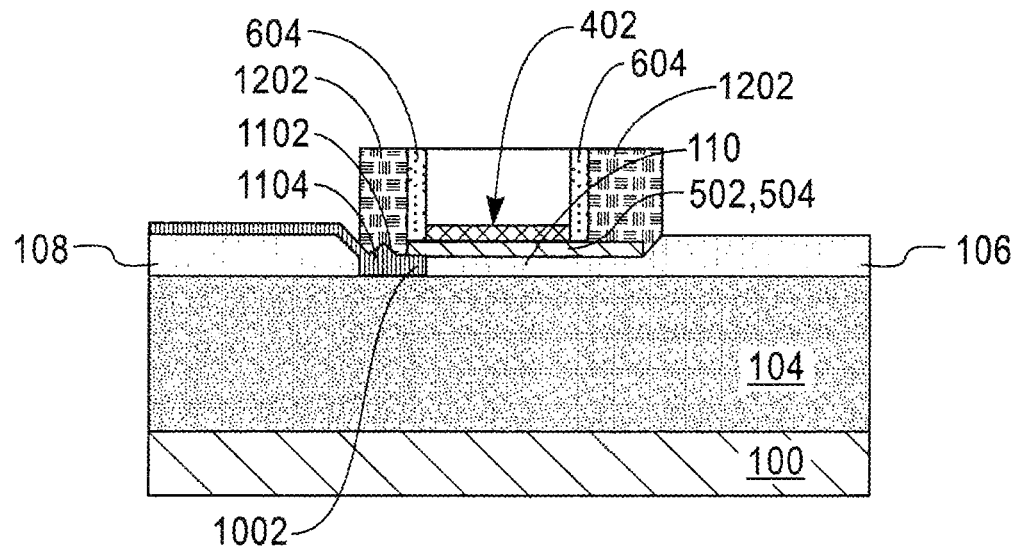

FIG. 11 illustrates a cross-sectional view of the structure following the formation of a spacer 1202. The spacer 1202 is formed by depositing a layer of spacer material such as, for example, silicon nitride or silicon dioxide and etching the spacer material using, for example, RIE to form the spacers 1202. The hardmask layer 406 may also be removed in the RIE process.

Figure 12:
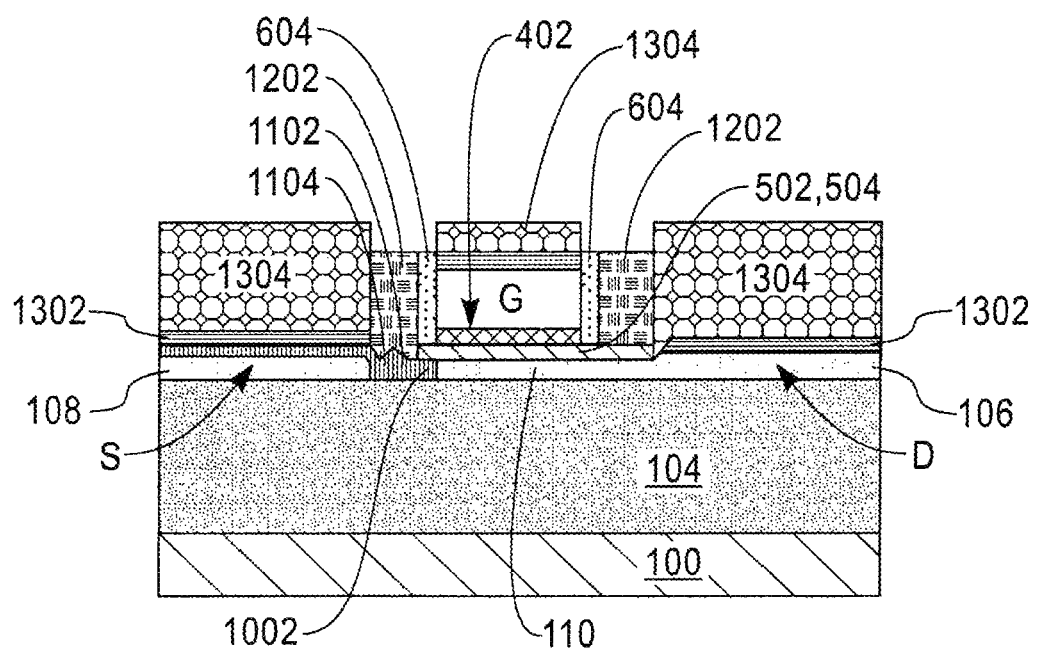

FIG. 12 illustrates the resultant structure following silicidation where a silicide 1302 is formed on the SOI pad region 106 (the drain region D) and the SOI pad region 108 (the source region S), and over the polysilicon layer 404 (the gate region G). Examples of silicide forming metals include Ni, Pt, Co, and alloys such as NiPt. When Ni is used the NiSi phase is formed due to its low resistivity. For example, formation temperatures include 400-600° C. Once the silicidation process is performed, capping layers and vias for connectivity (not shown) may be formed and a conductive material such as, Al, Au, Cu, or Ag may be deposited to form contacts 1304.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/ or components, but do not preclude the presence or addition of one ore more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A nanowire tunnel field effect transistor (FET) device, comprising:
    a channel region disposed on a semiconductor substrate including a silicon portion having a first distal end and a second distal end, the silicon portion is surrounded by a gate structure disposed on the silicon portion;
    a drain region including an n-type doped silicon portion extending from the first distal end;
    a cavity partially defined by the second distal end of the silicon portion and an inner diameter of the gate structure;
    a source region including a doped epi-silicon nanowire extension epitaxially extending from the second distal end of the silicon portion in the cavity.

2. The device of claim 1, wherein the n-type doped silicon portion is connected to a first pad region disposed on the semiconductor substrate.

3. The device of claim 1, wherein the doped epi-silicon nanowire extension is connected to a second pad region disposed on the semiconductor substrate.

4. The device of claim 2, wherein the first pad region includes a silicide material.

5. The device of claim 3, wherein the second pad region includes a silicide material.

6. The device of claim 1, wherein the epi-silicon nanowire extension fills the cavity.

7. The device of claim 1, wherein the epi-silicon nanowire extension is uniformly doped.

* * * * *